United States Patent [19]
Yu et al.

[11] Patent Number: 6,128,233
[45] Date of Patent: Oct. 3, 2000

[54] DATA TRANSMISSION CIRCUITRY OF A SYNCHRONOUS SEMICONDUCTOR MEMORY DEVICE

[75] Inventors: Hak-Soo Yu; Su-Chul Kim, both of Seoul, Rep. of Korea

[73] Assignee: Samsung Electronics, Co., Ltd., Suwon, Rep. of Korea

[21] Appl. No.: 09/370,842

[22] Filed: Aug. 9, 1999

[30] Foreign Application Priority Data

Aug. 7, 1998 [KR] Rep. of Korea ................. 98-32232

[51] Int. Cl.$^7$ ............................................. G11C 7/00
[52] U.S. Cl. ........................... 365/189.02; 365/189.12; 365/238.5; 365/233
[58] Field of Search ................................. 365/233, 238, 365/238.5, 230.02, 189.02, 189.12

[56] References Cited

U.S. PATENT DOCUMENTS

| | | | |
|---|---|---|---|
| 4,891,795 | 1/1990 | Pinkham et al. | 365/230.03 |
| 5,875,132 | 2/1999 | Ozaki | 365/189.03 |
| 5,978,307 | 11/1999 | Proebsting et al. | 365/230.05 |
| 5,978,309 | 11/1999 | Seyyedy et al. | 365/230.06 |

*Primary Examiner*—Son Mai
*Attorney, Agent, or Firm*—Marger Johnson & McCollom, P.C.

[57] ABSTRACT

A synchronous memory comprising: a memory cell array being comprised of a plurality of memory cells; a clock control circuit for receiving a first clock signal, a second clock signal, and a third clock signal, and for generating an internal clock signal, a plurality of control signals, and a plurality of flag signals; a first register circuit for storing a plurality of input data bits in response to the internal clock signal and the control signals; a second register circuit for storing the flag signals in response to the internal clock signal and the control signals; a write drive circuit for writing the input data bits passing through the first register circuit into the memory cell array in response to the flag signals during a write cycle; a sense amplifier circuit coupled to the memory cell array; an address comparator circuit for receiving read and write address signals and for generating a first, a second, and a third combination signals; and a switching circuit for transferring the input data bits passing through the first register circuit and the flag signals passing through the second register circuit to output terminals of the device.

1 Claim, 7 Drawing Sheets

DATA TRANSMISSION CIRCUITRY OF A SYNCHRONOUS SEMICONDUCTOR MEMORY DEVICE

FIELD OF THE INVENTION

The present invention relates to a synchronous semiconductor memory, and more particularly to a data transmission of a synchronous memory device which responds to an external clock signal.

BACKGROUND OF THE INVENTION

In a computer processing system, operation speeds of dynamic random access memories used as main memories have been increased, but are still low compared with operation speeds of microprocessors. It has been reported that above fact increases a wait time of the microprocessor, and impedes fast data processing, as an access time and a cycle time of the DRAM form a bottleneck in a whole system performance. In order to eliminate a difference in the operation speed between the DRAM and microprocessor, synchronous memory devices operable in synchronization with a clock signal have recently been developed, and SDRAMs have been used as main memories for fast microprocessors. In the SDRAM, introducing of external signals, i.e., address signals and control signals as well as input/output data are carried out in synchronization with a clock signal which is namely a system clock provided by the microprocessor. Since the external signals are taken into the SDRAM device in synchronization consideration, and thereby an internal operation can be started rapidly. And since input and output data are transferred therein in synchronization with the clock signal, the accessing speed of data corresponds to the clock signal, allowing fast data transmission to be accomplished.

As one of attractive functions of the SDRAM, continuous bits per data input/output terminal make an access speed of data be more enhanced, i.e., a pipelined SDRAM. A burst length, of the pipelines SDRAM, that is the number of data bits continuously transferred to one input/output terminal in a sensing cycle (or a RAS cycle) becomes an important factor determining a capacity of data read-out in one sensing cycle in the synchronous memory device. In order to enhance the accessing speeds to be more than those of single-data-rate SDRAMs, there have been proposed double-data-rate SDRAMs that are accessible in response to each transition of the clock signal, i.e., responds to not only rising edges of the clock signal but also falling edges thereof. Either in the single- or double-data-rate SDRAMs, performance of a data transmission in the SDRAM is mostly dependent upon controlling and optimizing the burst length or relevant accessing features such as a bypass architecture, in correspondence with the clock signal. It is general that the burst length is flexible corresponding to designing options and influences the operation frequency of the clock signal.

FIG. 1 shows a circuit construction for performing a data transmission in a synchronous memory device, being comprised of pad 1, input registers 2 and 3, multiplexer 4, and output driving transistor 5. Pad 1 coupled to drain of transistor 5, and registers 2 and 3 transfers external input data to the registers and output data driven by transistor 5 to an external circuit (not shown, out of the device). The registers, 2 and 3, receive input reference signals, and stores the input data to be applied to internal circuits in response to a pair of complementary clock signals CLK and CLKB (suffix B of a signal name means a counter-logic of the signal and is identical to the numeral marked with over-bar in the corresponding drawing). Multiplexer 4 applies data generated from the internal circuits to gate of transistor 5 in response to the pair of clock signals CLK and CLKB.

In a write operation (burst length=2) of the data transmission circuit of FIG. 1, as shown in FIG. 2, each address bit of external addresses ADD are taken into the device in synchronization with an rising edge of clock signal CLK (i.e., a system clock). Addresses A and B which are used in this write operation are introduced thereinto at rising edges of the first and second cycles, respectively, of clock cycle CLK. Then, input data DATA in DA0 and DA1, and DB0 and DB1 are applied to the internal circuits through the data transmission circuit from the second cycle of clock signal CLK. DA0 and DA1 correspond to address A, and DB0 and DB1 to B. Each bits of the input data is accessed at rising and falling edges of clock signal CLK, i.e., the double-data-rate mode. However, when a read cycle is started just after the write cycle, without through a dummy cycle which is to be interposed between a write cycle and a read cycle, as shown in FIG. 2, it is impossible to write the input data bits DA1, DB0, and DB1 into memory cells designated by the addresses A and B, except DA0, because of a write recovery. Therefore, though the input data bits DA1, DB0, and DB1 are successfully taken into the device, those can not be written into memory cells selected by the addresses A and B during a write recovery period.

SUMMARY OF THE INVENTION

Accordingly, it is an object of the invention to provide a synchronous memory device having flexible data accessing operations adaptable to various read and write timings.

It is another object of the invention to provide a synchronous memory device having a flexible burst length and having various data accessing configurations in accordance to variation of read and write operating modes.

In order to accomplish those objects, a synchronous memory is comprised of a memory cell array being comprised of a plurality of memory cells, a clock control circuit for receiving a first clock signal, a second clock signal, and a third clock signal, and for generating an internal clock signal, a plurality of control signals, and a plurality of flag signals, a first register circuit for storing a plurality of input data bits in response to the internal clock signal and the control signals, a second register circuit for storing the flag signals in response to the internal clock signal and the control signals, a write drive circuit for writing the input data bits passing through the first register circuit into the memory cell array in response to the flag signals during a write cycle, a sense amplifier circuit coupled to the memory cell array, an address comparator circuit for receiving read and write address signals and for generating a first, a second, and a third combination signals, and a switching circuit for transferring the input data bits passing through the first register circuit and the flag signals passing through the second register circuit to output terminals of the device.

BRIEF DESCRIPTION OF THE DRAWINGS

For a better understanding of the invention, and to show how embodiments of the same may be carried into effect, reference will now be made, by way of example, to the accompanying diagrammatic drawings, in which.

In the figures, like reference numerals denote like or corresponding parts.

DETAILED DESCRIPTION OF PREFERRED EMBODIMENTS

Hereinbelow, applicable embodiments of the invention will be as follows, with the appended drawings.

Figure 1:
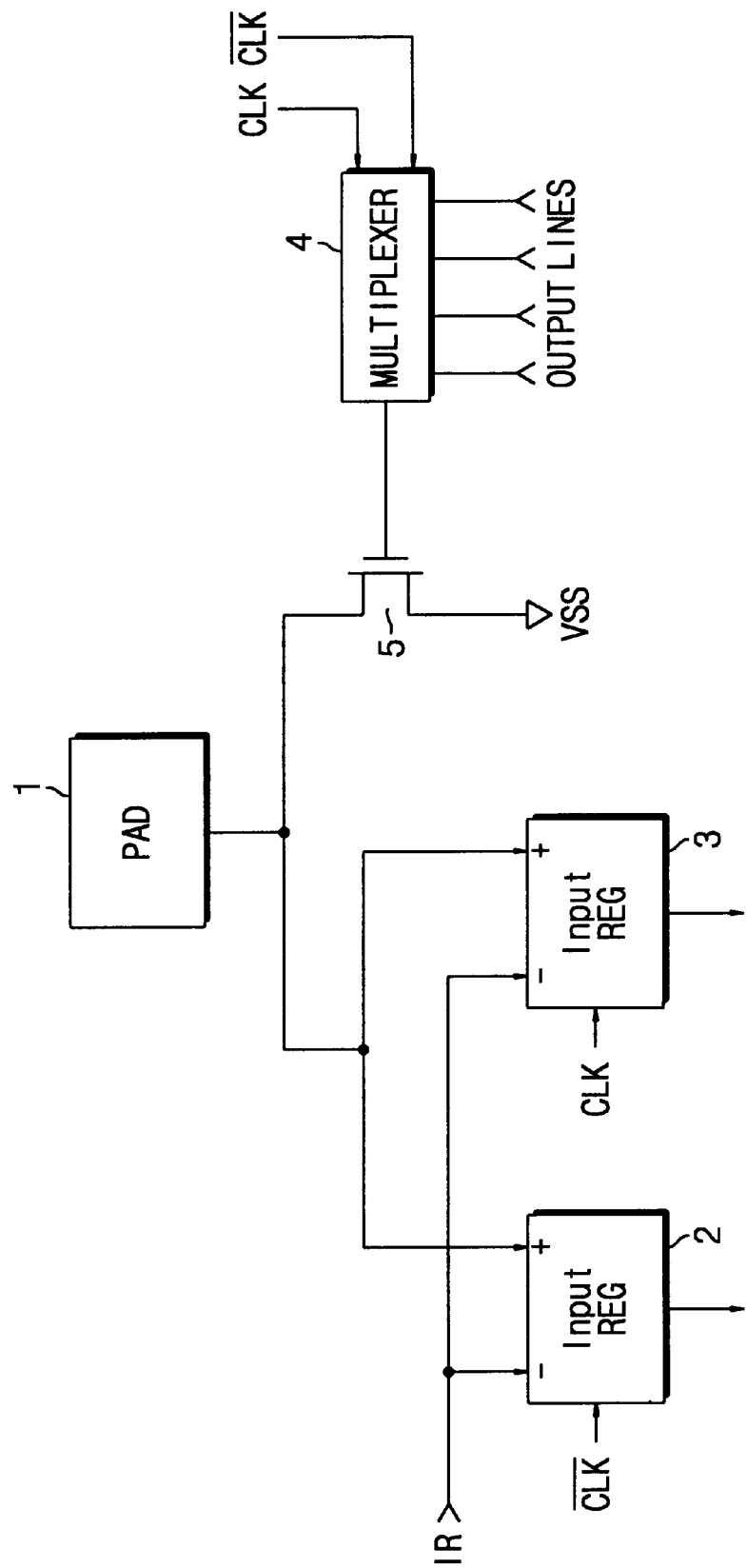
FIG. 1 is a block diagram of a known data transmission circuit of a synchronous memory device.
Figure 2:
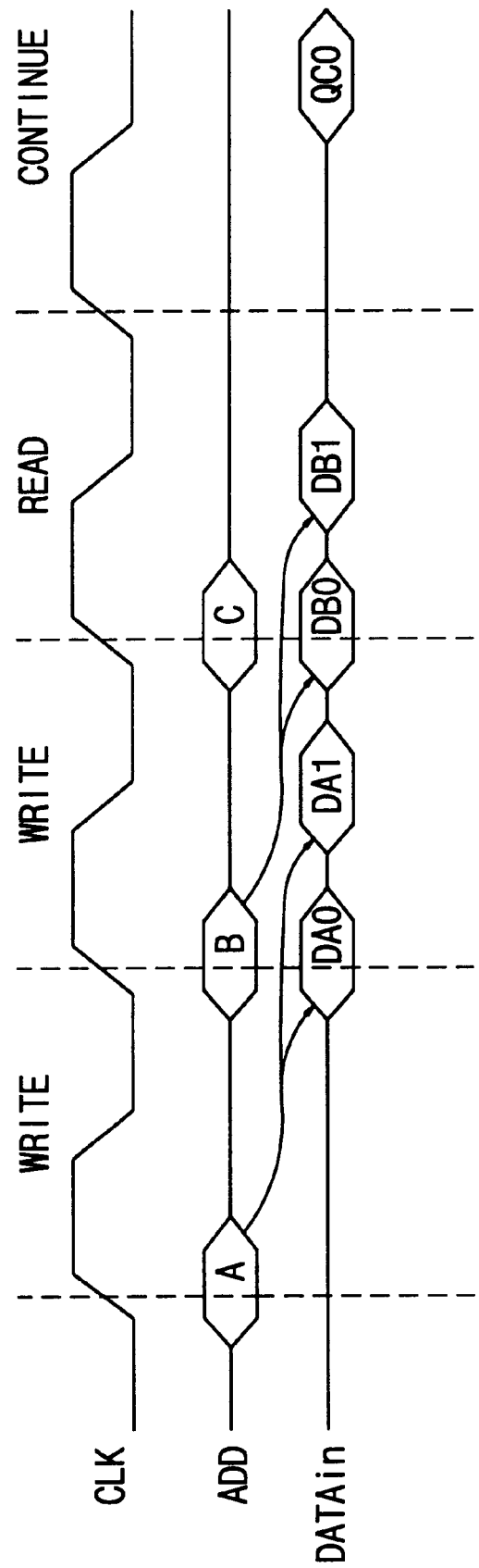
FIG. 2 is a timing diagrams showing the operation of the circuit in FIG. 1.
Figure 3:
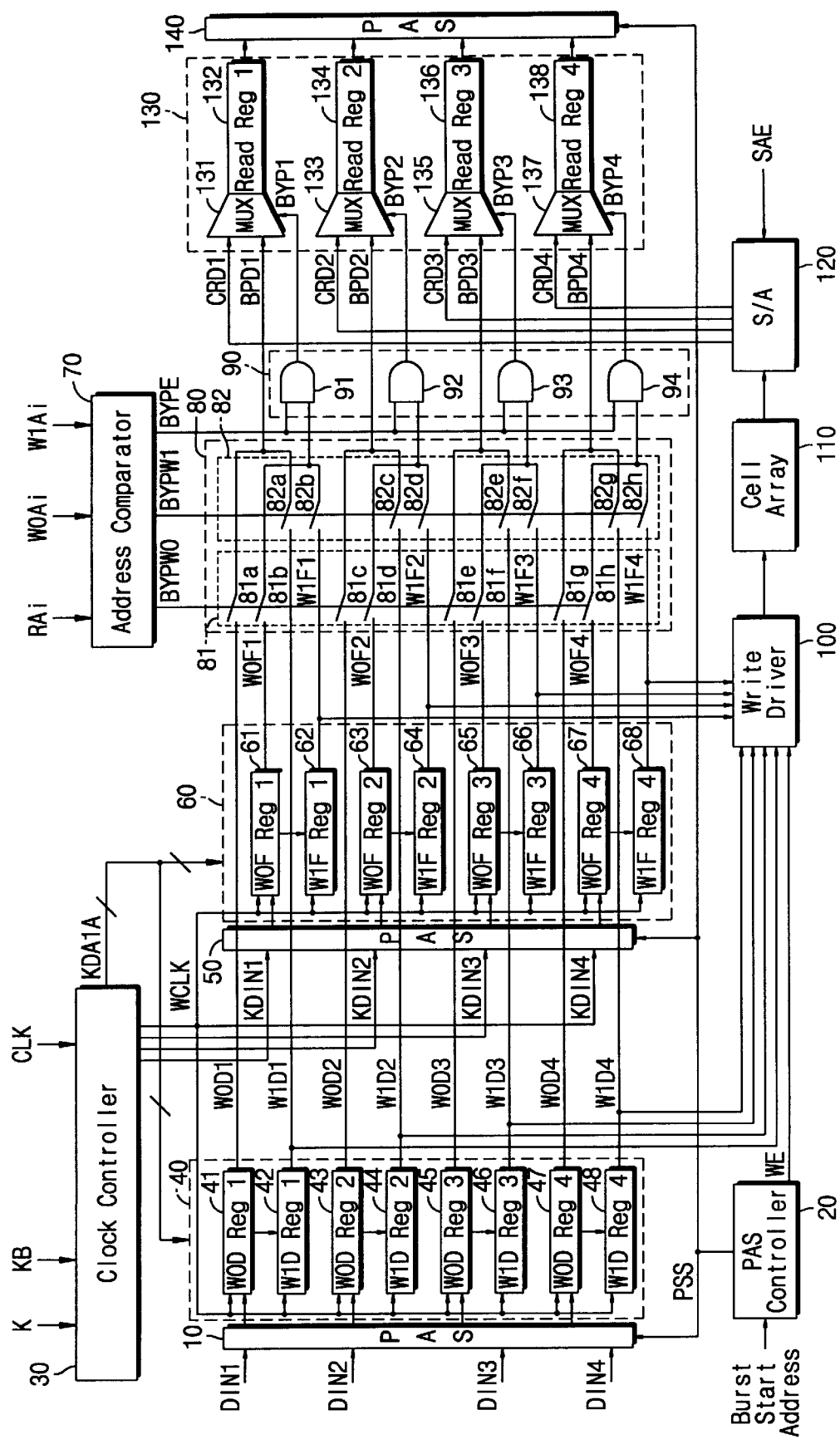
FIG. 3 is a schematic diagram showing an arrangement of data transmission circuitry in a synchronous memory device according to the present invention.

Referring to FIG. 3, a synchronous memory device of the invention includes path selection circuits 10, 50, and 140, path selection control circuit 20, clock control circuit 30, write register circuit 40, read register circuit 60, address comparator 70, switching circuit 80, output control circuit 90, write drive circuit 100, memory cell array 110, sense amplifier circuit 120, and data output circuit 130. Path selection circuits 10, 50, and 140 determine conducting paths of external input data in response to path selection signal PSS generated from path selection control circuit 20. Path selection control circuit 20 receives burst starting address BSA and generates path selection signal PSS and write enable signal WE. Clock control circuit 30 receives external clock signals K, KB, and CCLK which is used for controlling read/write operations, and generates internal clock signal WCLK, flag signals KDIN1–KDIN4, and control signals KDA1A1–KDA1A4. Register circuits 40 and 60 store the input data and flag signals KDIN1–KDIN4 in response to clock signal WCLK and control signals KDA1A1–KDA1A4. Address comparator 70 generates signals BYPW0, BYPW1, and BYPE made from comparing read and write addresses RAi, WOAi, and WIAi with themselves.

Switching circuit 80 makes conduction paths of the input data and flag signals WOF1, WIF1, WOF2, WIF2, WOF3, WIF3, WOF4, and WIF4 be selectively opened in response to the comparing signals BYPW0 and BYPW1. Switching circuit 80 is formed of two switching units 81 and 82. In switching unit 81 including plural switches 81a–81h, switches 81a, 81c, 81e, and 81g are connected between registers 41, 43, 45, and 47 and data output circuit 130, and open and close conduction paths of input data DIN1–DIN4. Switches 81b, 81d, 81f, and 81h are connected between registers 61, 63, 65, and 67 of write register circuit 60 and output control circuit 90, and open and close conduction paths of flag signals KDIN1–KDIN4 supplied from register circuit 40, in response to signal BYPW0 generated from address comparator 70. In switching unit 82 including plural switches 82a–82h, switches 82a, 82c, 82e, and 82g are connected between registers 42, 44, 46, and 48 and data output circuit 130, and open and close conduction paths of input data DIN1–DIN4 supplied from write register circuit 40. Switches 82b, 82d, 82f, and 82h are connected between registers 62, 64, 66, and 68 of write register circuit 60 and output control circuit 90, and open and close conduction paths of flag signals KDIN1–KDIN4 supplied from register circuit 60, in response to signal BYPW1 generated from address comparator 70. Output control circuit 90 receives flag signals WOF1–WIF4 from switching circuit 80, and generates output control signals BYP1–BYP4. Output control circuit 90 is formed of AND gates 91–94. AND gate 91 is connected between switches 81b and 82b, signal line of BYPE, and data output circuit 130, and makes output control signal BYP1 from combining flag signal KDIN1 supplied through switches 81b and 82b, with signal BYPE generated from address comparator 70. AND gate 92 is connected between switches 83b and 84b, signal line of BYPE, and data output circuit 130, and makes output control signal BYP2 from combining flag signal KDIN2 supplied through switches 83b and 84b, with signal BYPE generated from address comparator 70. AND gate 93 is connected between switches 85b and 86b, signal line of BYPE, and data output circuit 130, and makes output control signal BYP3 from combining flag signal KDIN3 supplied through switches 85b and 86b, with signal BYPE generated from address comparator 70. AND gate 94 is connected between switches 87b and 88b, signal line of BYPE, and data output circuit 130, and makes output control signal BYP4 from combining flag signal KDIN4 supplied through switches 87b and 88b, with signal BYPE generated from address comparator 70.

Write drive circuit 100 is connected between register circuits 40 and 60, path selection control circuit 20, and memory cell array 110, and includes four write drivers. The write drivers write input data DIN1–DIN4 supplied from write register circuit 40 into corresponding memory cells of memory cell array 110, in response to flag signals WIF1, WIF2, WIF3, and WIF4 supplied from register circuit 60.

Memory cell array 110 includes a plurality of memory cells coupled to wordlines and bit lines which are arranged in a matrix form, and store input data DIN1–DIN4 supplied through write drive circuit 100. Sense amplifier circuit 120 is connected between memory cell array 110 and data output circuit 130, including four sense amplifiers. The sense amplifiers detect data levels of data from corresponding memory cells of memory cell array 110, in response to sensing enable signal SAE.

Data output circuit 130 includes multiplexers 131, 133, 135, and 137, and read registers 132, 134, 136, and 138. Multiplexers 131–137 are connected between switching circuit 80, output control circuit 90, and sense amplifier circuit 120, and alternatively transfer bypass data BPD1–BPD4 from switching circuit 80 and read-out data CRD1–CRD4 from amplifier circuit 120 to respectively corresponding registers 132–138. Read registers 132–138 are connected between multiplexers 131–137 and path selection circuit 140, and store selectively corresponding data out of bypass data BPD1–BPD4 and read-out data CRD1–CRD4. Path selection circuit 140 is connected between the read registers of data output circuit 130 and data buses (not shown), and transfers a selected one out of the bypass and read-out data to the data buses.

Register circuit 40 includes plural registers 41–48. The registers are connected in parallel each other between path selection circuit 10 and switching circuit 80, and store input data DIN1–DIN4 supplied through path selection circuit 10, in response to write control clock signal WCLK.

Figure 4:
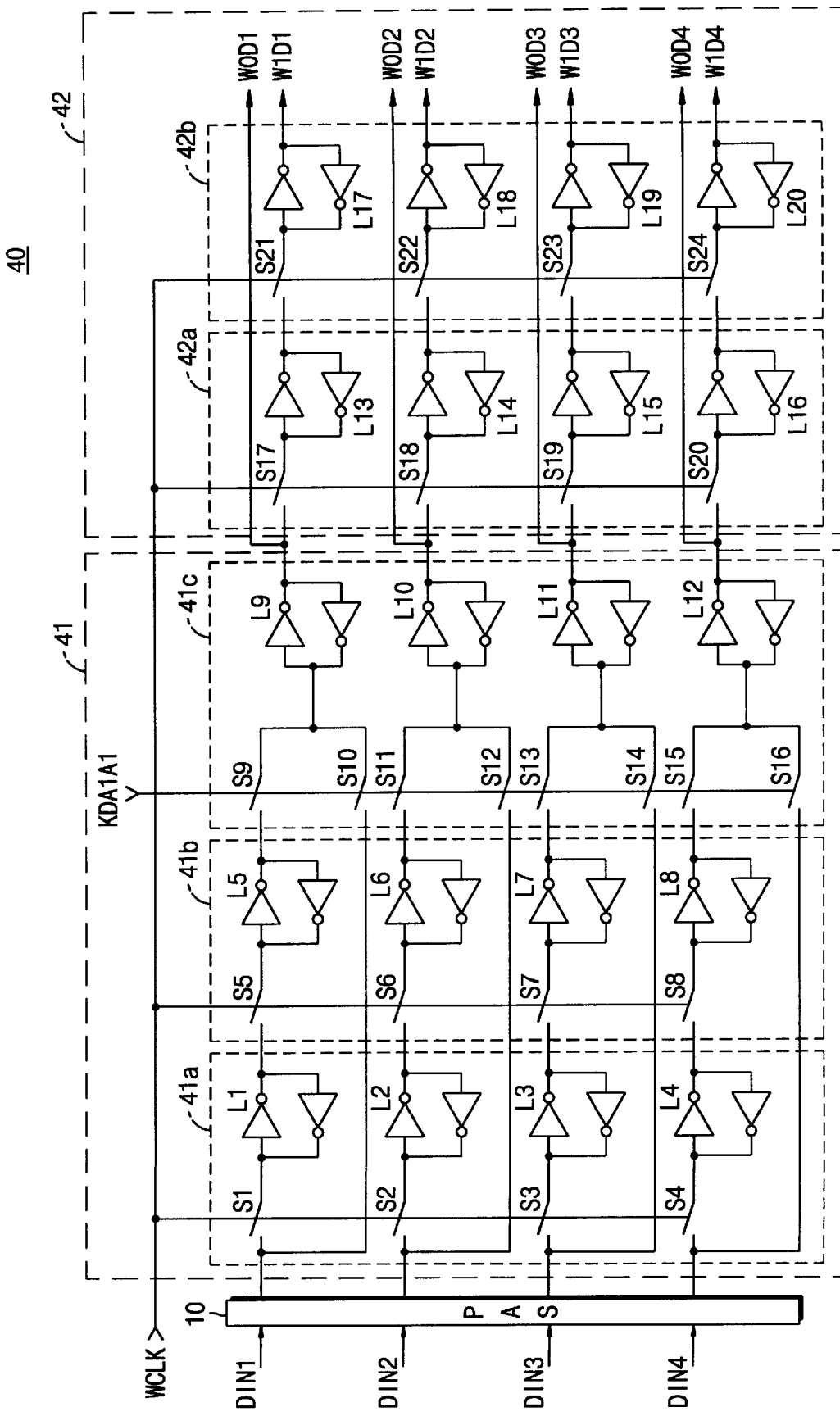
FIG. 4 is a circuit diagram of an input data storage circuit of FIG. 3.

Referring to FIG. 4, register 41 is formed of three latching stages 41a, 41b, and 41c serially connected each other, each of stages 40a and 41b being constructed of one switch and one latch while stage 41c of two switches and one latch. In the first latching stage 40a, switches S1–S4 are connected between output terminals of path selection circuit 10 and latches L1–L4, and transfer input data DIN1–DIN4 to latches L1–L4, respectively, in response to clock signal WCLK. Latches L1–L4 are connected between switches S1–S4 and switches S5–S8 belong to register 41b, and store input data DIN1–DIN4 transferred by the switches S1–S4.

The second latching stage 41b of register circuit 41 is formed of switches S5–S8 and latches L5–L8. Switches S5–S8 are connected between latches L1–L4 and latches L5–L8, and transfer input data DIN1–DIN4, supplied through the first latching stage 40a, to latches L5–L8, respectively, in response to clock signal WCLK. Latches L5–L8 are connected between switches S5–S8 and switches S9, S11, S13, and S15 belong to register 41c, and store input data DIN1–DIN4 transferred by the switches S5–S8. The third latching stage 41c of register circuit 41 is formed of switches S9–S16 and latches L9–L12. Switches S9, S11, S13, and S15 are connected between latches L5–L8 and latches L9–L12, and transfer input data DIN1–DIN4, supplied through the second latching stage 41b, to latches L9–L12, respectively, in response to control signal KDA1A1 generated from clock control circuit 30. On the contrary, switches S10, S12, S14, and S16 are connected directly between the output terminals of path selection circuit 10 and latches L9–L12, also coupled with switches S9, S11, S13, and S15 at their terminals coupled to the latches L9–L12. Latches L9–L12 are connected between switches S9–S16 and switches S17–S20 belong to register 42, and store input data DIN1–DIN4 transferred through switches S9, S11, S13, and S15, or transferred through switches S10, S12, S14, and S16 directly from path selection circuit 10. Outputs of latches L9–L12 becomes data signals WOD1–WOD4 which are applied to switching circuit 80.

Register 42 is formed of two latching stages 42a and 42b serially connected each other, each stage being constructed of one switch and one latch. In the first latching stage 42a, switches S17–S20 are connected between latches L9–L12 and latches L13–L16, and transfer input data DIN1–DIN4, which are transferred through latches L9–L12, to latches L13–L16, respectively, in response to clock signal WCLK. Latches L13–L16 are connected between switches S17–S20 and switches S21–S24 belong to the second stage register 42b, and store outputs of latches L9–L12 (i.e., WOD1–WOD4). The second latching stage 42b of register circuit 42 is formed of switches S21–S24 and latches L17–L20. Switches S21–S24 are connected between latches L13–L16 and latches L17–L20, and transfer the outputs of latches L13–L16 to latches L17–L20, respectively, in response to clock signal WCLK, Latches L17–L20 are connected to switches S21–S24, and store outputs of latches L13–L16. Outputs from latches L17 and L20 are data signals WID1–WID4 which are applied to switching circuit 80.

Figure 5:
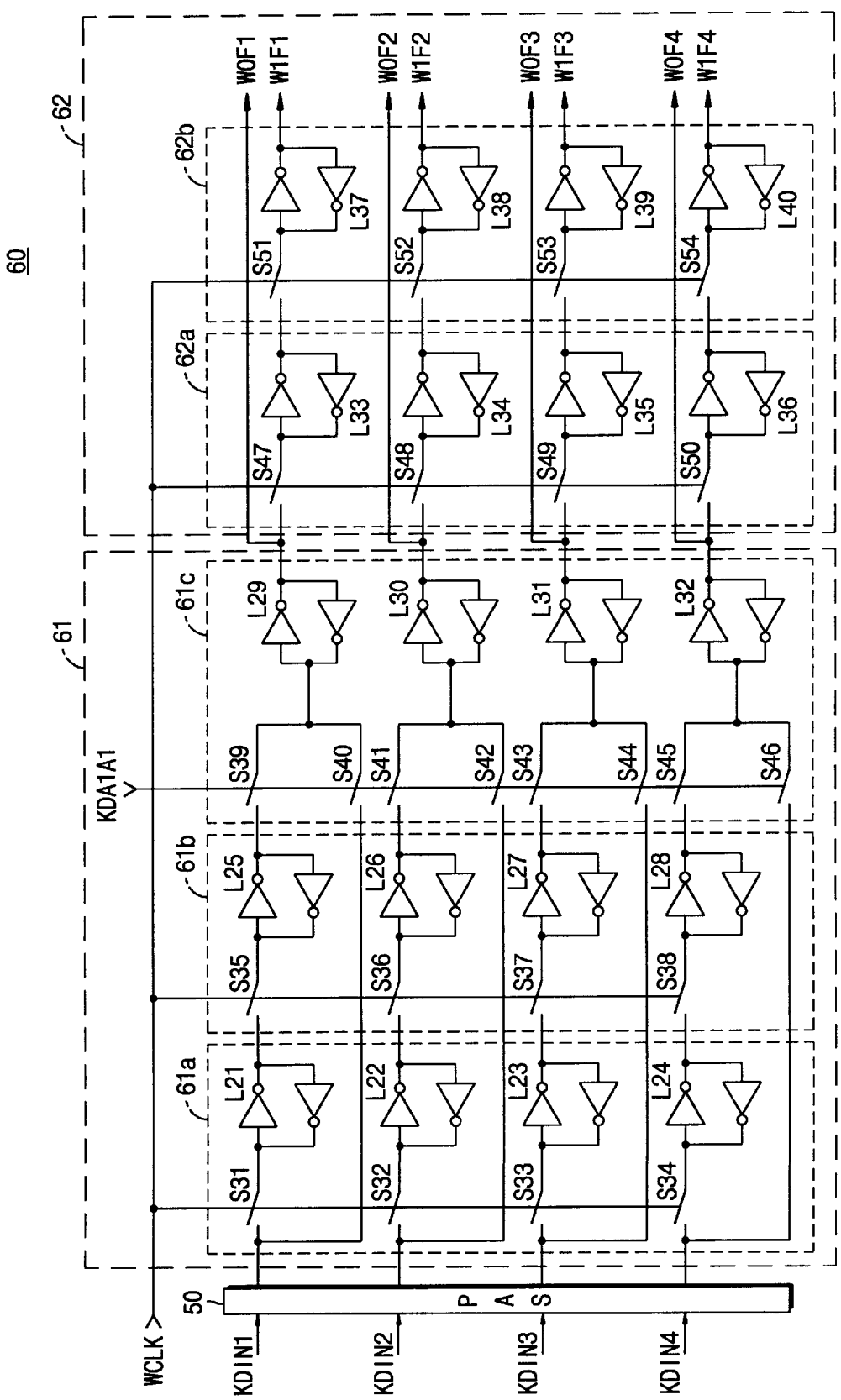
FIG. 5 is a circuit diagram of a flag storage circuit of FIG. 3.

Register circuit 60 includes plural registers 61–68. The registers are connected in parallel each other between path selection circuit 50 and switching circuit 80, and store flag signals KDIN1–KDIN4 supplied through path selection circuit 50, in response to write control clock signal WCLK. Referring to FIG. 5, register 61 is formed of three latching stages 61a, 61b, and 61c serially connected each other, like those of 41, each of stages 61a and 61b being constructed of one switch and one latch while stage 61c of two switches and one latch. In the first latching stage 61a, switches S31–S34 are connected between output terminals of path selection circuit 50 and latches L21–L24, and transfer flag signals KDIN1–KDIN4 to latches L21–L24, respectively, in response to clock signal WCLK. Latches L21–L24 are connected between switches S31–S34 and switches S35–S38 belong to register 61b, and store flag signal KDIN1–KDIN4 transferred by the switches S31–S34. The second latching stage 61b of register circuit 61 is formed of switches S35–S38 and latches L25–L28. Switches S35–S38 are connected between latches L21–L24 and latches L25–L28, and transfer flag signals KDIN1–KDIN4, supplied through the first latching stage 61a, to latches L25–L28, respectively, in response to clock signal WCLK.

Latches L25–L28 are connected between switches S35–S38 and switches S39, S41, S43, and S45 belong to register 61c, and store flag signals KDIN1–KDIN4 transferred by the switches S35–S38. The third latching stage 61c of register circuit 61 is formed of switches S39–S46 and latches L29–L32. switches S39, S41, S43, and S45 are connected between latches L25–L28 and latches L29–L42, and transfer flag signals KDIN1–KDIN4, supplied through the second latching stage 61b, to latches L29–L32, respectively, in response to control signal KDA1A1 generated from clock control circuit 30. On the contrary, switches S40, S42, S44, and S46 are connected directly between the output terminals of path selection circuit 50 and latches L29–L32, also coupled with switches S39, S41, S43, and S45 at their terminals coupled to the latches L29–L32. Latches L29–L32 are connected between switches S39–S46 and switches S47–S50 belong to register 62, and store flag signals KDIN1–KDIN4 transferred through switches S39, S41, S43, and S45, or transferred through switches S40, S42, S44, and S46 directly from path selection circuit 50. Outputs of latches L29–L32 becomes data signals WOF1–WOF4 which are applied to switching circuit 80.

Register 62 is formed of two latching stages 62a and 62b serially connected each other, each stage being constructed of one switch and one latch. In the first latching stage 62a, switches S47–S50 are connected between latches L29–L32 and latches L33–L36, and transfer flag signal KDIN1–KDIN4, which are transferred through latches L29–L32, to latches L33–L36, respectively, in response to clock signal WCLK. Latches L33–L36 are connected between switches S47–S50 and switches S51–S54 belong to the second stage register 62b, and store outputs of latches L29–L32 (i.e., WOF1–WOF4). The second latching stage 62b of register circuit 62 is formed of switches S51–S54 and latches L37–L40. Switches S51–S54 are connected between latches L33–L36 and latches L37–L40, and transfer the outputs of latches L33–L36 to latches L37–L40, respectively, in response to clock signal WCLK. Latches L37–L40 are connected to switches S21–S24, and store outputs of latches L33–L36. Outputs from latches L37 and L40 are data signals WIF1–WIF4 which are applied to switching circuit 80.

Figure 6:
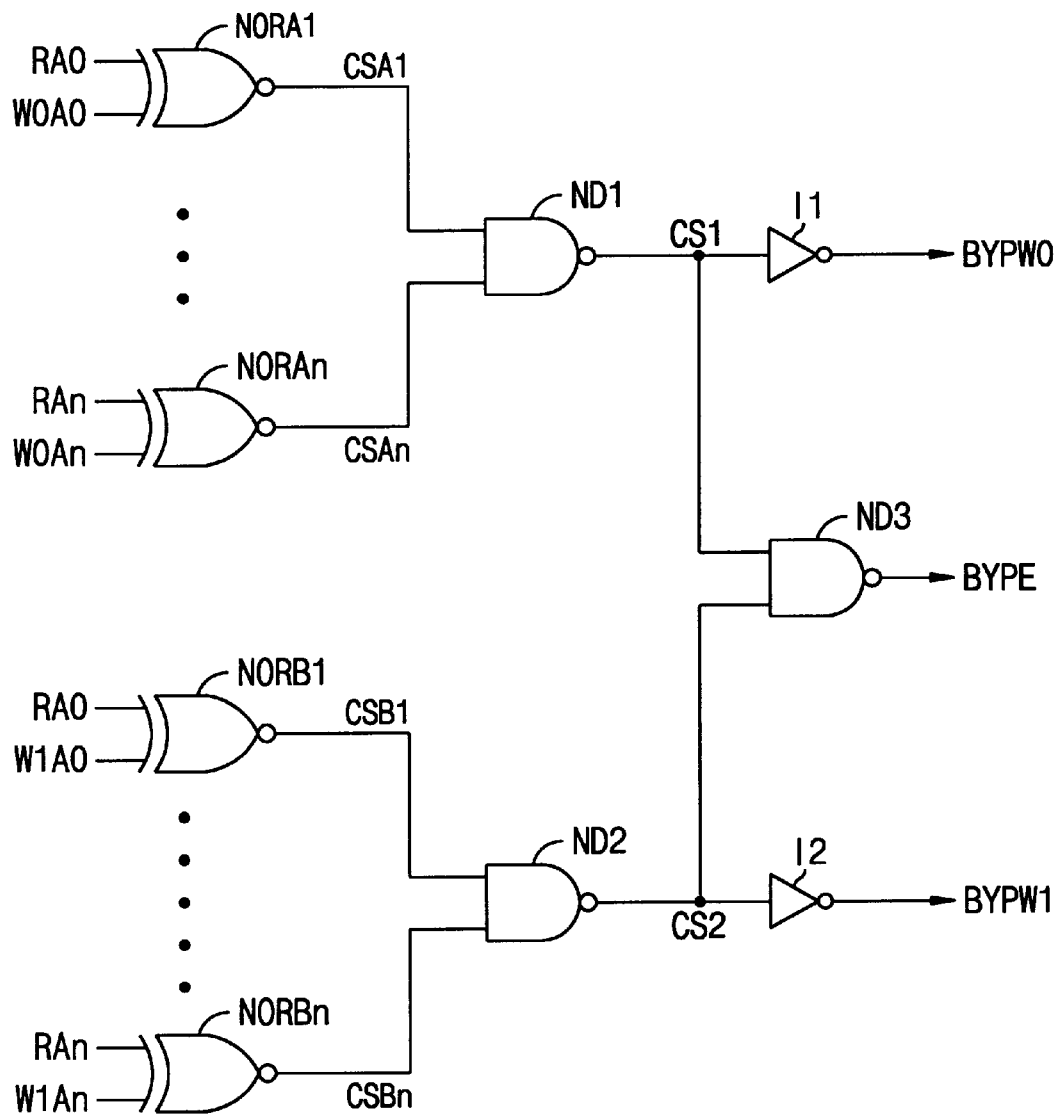
FIG. 6 is a circuit diagram of an address comparator circuit of FIG. 3.

Address comparator receives external addresses RAi, WOAi, at input terminals thereof, and generates signals BYPW0 for controlling switches 81a–81h of switching circuit 80, signal BYPW1 for controlling switches 82a–82h of switching circuit 80, and signal BYPE for permitting AND gates 91–94 of output control circuit 90 to be conductive. Referring to FIG. 6, address comparator 70 is formed of two groups of exclusive NOR gates NORA1–NORAn and NORB1–NORBn, NAND gates ND1–ND3, and inverters I1 and I2. One group of exclusive NOR gates NORA1–NORAn are connected between input terminals of external addresses RAi and WOAi and input terminals of NAND gate ND1, and generates one group of combination signals CSA1–CSAn. The other group of exclusive NOR gates NORB1–NORBn are connected between input terminals of external addresses RAi and WIAi and input terminals of NAND gate ND2, and generates one group of combination signals CSB1–CSBn. NAND gate ND1 receives combination signals CSA1–CSAn supplied from exclusive NOR gates NORA1–NORAn, and generates combination signal CS1. NAND gate ND2 receives combination signals CSB1–CSBn supplied from exclusive NOR gates NORB1–NORBn, and generates combination signal CS2. NAND gate ND3 receives the secondary combination signals CS1 and CS2, and generates control signal BYPE, while CS1 and CS2 become BYPW0 and BYPW1 each through inverters I1 and I2.

Figure 7:
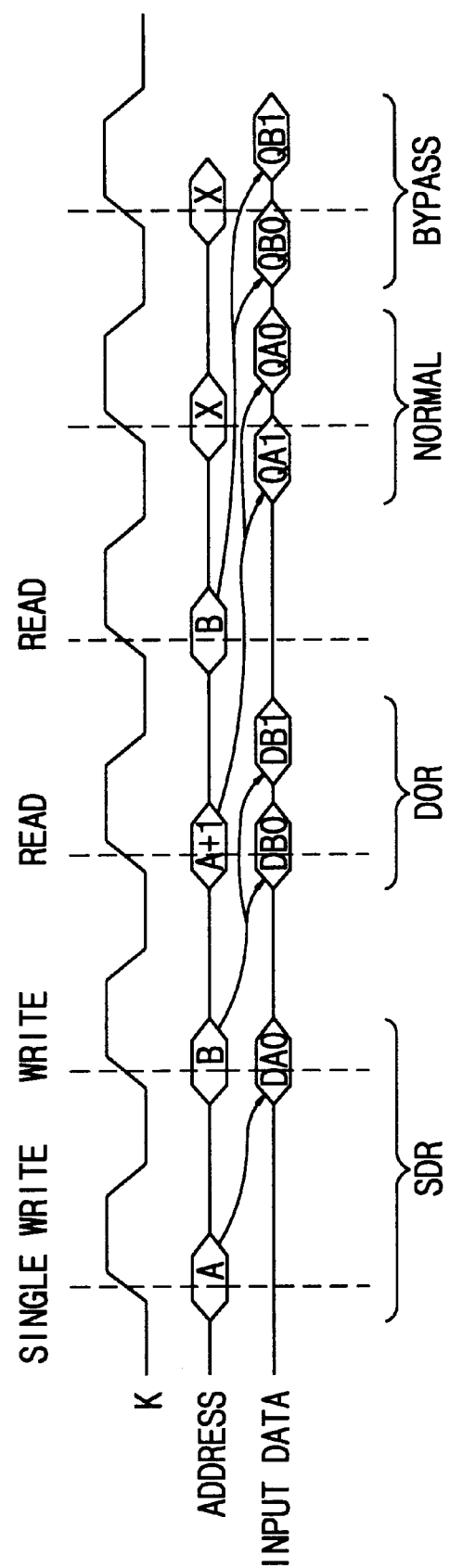
FIG. 7 is a timing diagram showing a data transmission operation with the circuits of FIG. 3.

Now, hereinafter, an explanation about a sequence of data transmission in the present synchronous device will be succeeded. Ahead of a practical explanation, it would be understood that a synchronous memory device performing its read/write operations in synchronization with an external clock signal is classified into two types in data accessing manner, i.e., single-data-rate (SDR) and double-data-rate (DDR) as aforementioned, the SDR accessing a data bit for one cycle period of the clock signal while the DDR accessing two data bits for one cycle period of the clock signal, and the number of output data bits corresponding to one address is dependent upon a value of burst length by which a manner of read/write operations is determined. And latency which determines a starting time of writing or reading after an input of address is divided into two types; one is that the writing is conducted in one cycle time of the clock signal (standard write protocol; SWP), and the other is in two cycles or more (late write protocol; LWP). FIG. 7 shows a late write protocol and a register read protocol, and may be operable in a single read/write mode or a double read/write mode (burst length is 2).

It is assumed that, in an embodiment of data transmission of the invention, that the DDR is adaptable to latency of 4 that is the largest and the SDR is to latency of 2, and the LWP is used therein and the burst length is 2. Referring to FIG. 7, if input data bit DA0 (=DIN1) corresponding to external address A is introduced into the device for the first cycle of clock signal K in accordance with the SDR mode, and input data bits DB0 and DB1, corresponding to address B, are taken into the device for the second cycle of clock signal K under the DDR mode, path selection circuit 10 supplies input data bit DA0 to write register circuit 40 in response to path selection signal PSS. At this time, clock control circuit 30 receives clock signals K and KB, and generates write control clock signal WLCK and switching control signals KDA1A1 for controlling register circuits 40 and 60. Input data bit DA0 is stored into one of registers 41, 43, 45, and 47 in register circuit 40 for the second cycle of clock signal K. And, flag signal KDIN1 is applied to path selection circuit 50 and stored in one of registers 61, 63, 65, and 67 of register circuit 60, setting a corresponding one out of flag signals WOF1–WOF4.

When input data bit DA0 is applied to register 41 and 42 of register circuit 40 by path selection circuit 10, DA0 is stored in one of registers 41 and 42 of register circuit 40 in response to control signal KDA1A1, and then driven into memory cell array 110 through switching circuit 80, or directly driven into output circuit 130 to be a bypass data bit. Meanwhile, when flag signal KDIN1 is applied to registers 61 and 62 of register circuit 60, KDIN1 is stored into one of registers 61 and 62 in accordance with the SWP (standard-write-protocol) mode by clock signal WCLK and control signal KDA1A1, and then applied to AND gate 91 of output control circuit 90 through switching circuit 80.

When, in the third cycle of clock signal K for which data bits QA1 and QA0, corresponding to address A+1 (a burst starting address; this is different from the A), are read out from the memory cell array, one of the data bits (e.g., QA0) which is included in a set of a predetermined burst length is accessed in a bypass read-out condition, flag signals KDIN1 and KDIN2 are applied to path selection circuit 50 in synchronization with rising and falling edges of clock signal K. And then, flag signals KDIN1 and KDIN2 are stored into two registers out of registers 61, 63, 65, and 67 of register circuit 60 by path selection circuit 50, and two flag signals out of WOF1–WOF4 are set into an active state therefrom. At the same time, data DA0 and KDIN1 respectively stored in the corresponding registers of register circuits 40 and 60 are driven into corresponding switches of switching circuit 80. Switching circuit 80 transfers data bit DA0 to its corresponding output terminal as bypass data bit QA0 in response to switching control signals BPW0 and BYPW1.

Address comparator 70 compares read address signals RAi with write address signals WOAi which are delayed by one clock cycle, and with write address signals WIAi which are delayed by two clock cycles, in order to distinguish a normal read-out data bit QA1, corresponding to A+1, from bypass data bit QA1 which also corresponds to A+1. If RAi are identical to WOAi, BYPW0 and BYPE are generated in active states, or, if RAi is identical to WIAi, BYPW1 is activated together with BYPE.

In the fourth cycle of clock signal K, a read operation, corresponding to address B which is the same with that in the second cycle of clock signal K, is conductive. During this period, as data bits DB0 and DB1 corresponding address B have been all situated in a written state and flag signals WOF1 and WOF2 have been set into an activation state, data bits DB0 and DB1 are accessed under a bypass transmission and thereby driven into bypass data bits QB0 and QB1.

As described above, the data transmission circuitry of the present synchronous memory device, including the path selection circuits, the path selection control circuit, the register circuits, the switching circuits, the address comparator, and the output control circuit, can provide an extended and flexible data accessing function which is adaptable to various read/write operating protocols such as a normal read-out, a bypass read-out, a standard writing, and a late writing, even in a circumstance of the device employing its basic operating manner such as the SDR, the DDR, or the burst length. Thus, the device according to the invention does not need a dummy cycle for the write recovery even when a read cycle is succeeded to a write cycle.

While this invention has been described in connection with what is presently considered to be the most practical and preferred embodiment, it is to be understood that the invention is not limited to the disclosed embodiment, but, on the contrary, is intended to cover various modifications and equivalent arrangements included within the scope of the invention.

What is claimed is:

1. A synchronous memory device comprising:

a memory cell array being comprised of a plurality of memory cells;

a clock control circuit for receiving a first clock signal, a second clock signal, and a third clock signal, and for generating an internal clock signal, a plurality of control signals, and a plurality of flag signals;

a first register circuit for storing a plurality of input data bits in response to the internal clock signal and the control signals;

a second register circuit for storing the flag signals in response to the internal clock signal and the control signals;

a write drive circuit for writing the input data bits passing through the first register circuit into the memory cell array in response to the flag signals during a write cycle;

a sense amplifier circuit coupled to the memory cell array, an address comparator circuit for receiving read and write address signals and for generating a first, a second, and a third combination signals; and a switching circuit for transferring the input data bits passing through the first register circuit and the flag signals passing through the second register circuit to output terminals of the device.

* * * * *

UNITED STATES PATENT AND TRADEMARK OFFICE
CERTIFICATE OF CORRECTION

PATENT NO. : 6,128,233  
DATED : October 3, 2000  
INVENTOR(S) : Hak-Soo Yu et al.

Page 1 of 1

It is certified that error appears in the above-identified patent and that said Letters Patent is hereby corrected as shown below:

Column 1,  
Line 29, "in synchronization consideration," should read -- in synchronization with the clock signal, it is not necessary to take a margin for skew of these external signals into consideration, --;

Column 5,  
Line 42, "WCLK, Latches" should read -- WCLK. Latches --;

Column 6,  
Line 6, "L29-L32. switches" should read -- L29-L32. Switches --;

Signed and Sealed this

Tenth Day of September, 2002

*Attest:*

*Attesting Officer*

JAMES E. ROGAN  
*Director of the United States Patent and Trademark Office*